(12) United States Patent
Leone et al.

(10) Patent No.: US 6,597,117 B2
(45) Date of Patent: Jul. 22, 2003

(54) PLASMA COIL

(75) Inventors: Mike Leone, Austin, TX (US); Jim Gernert, Austin, TX (US); Wei Sun, Austin, TX (US)

(73) Assignee: Samsung Austin Semiconductor, L.P., Austin, TX (US)

( * ) Notice: Subject to any disclaimer, the term of this patent is extended or adjusted under 35 U.S.C. 154(b) by 0 days.

(21) Appl. No.: 09/998,811

(22) Filed: Nov. 30, 2001

(65) Prior Publication Data

US 2003/0102811 A1 Jun. 5, 2003

(51) Int. Cl.$^7$ .................................................. H01J 7/24
(52) U.S. Cl. .............................. 315/111.21; 315/111.51
(58) Field of Search ....................... 315/111.21, 111.41, 315/111.51, 111.71, 111.81; 156/345.2, 345.23, 345.35

(56) References Cited

U.S. PATENT DOCUMENTS

| | | | | |
|---|---|---|---|---|
| 4,576,698 A | | 3/1986 | Gallagher et al. ........... 204/192 |
| 4,948,458 A | | 8/1990 | Ogle ........................... 156/643 |
| 5,339,064 A | * | 8/1994 | Bessho ....................... 335/282 |
| 5,401,350 A | * | 3/1995 | Patrick et al. ........... 156/345.48 |
| 5,731,565 A | | 3/1998 | Gates .................... 219/121.54 |
| 5,759,280 A | * | 6/1998 | Holland et al. ........... 118/723 I |
| 5,911,833 A | | 6/1999 | Denison et al. .............. 134/1.1 |
| 5,916,454 A | | 6/1999 | Richardson et al. .......... 216/67 |
| 6,117,349 A | | 9/2000 | Huang et al. ................. 216/71 |
| 6,168,696 B1 | * | 1/2001 | Burton et al. .......... 204/298.06 |
| 6,241,845 B1 | * | 6/2001 | Gadgil et al. .......... 156/345.37 |
| 6,265,031 B1 | * | 7/2001 | Ishii et al. .................. 427/460 |
| 6,291,938 B1 | * | 9/2001 | Jewett et al. ........... 315/111.51 |
| 6,319,355 B1 | * | 11/2001 | Holland .................. 156/345.48 |
| 6,444,084 B1 | * | 9/2002 | Collins .................... 118/723 I |
| 6,444,085 B1 | * | 9/2002 | Collins et al. ........... 118/723 E |
| 6,538,388 B2 | * | 3/2003 | Nakano et al. ......... 315/111.21 |

* cited by examiner

Primary Examiner—Don Wong
Assistant Examiner—Minh D A
(74) Attorney, Agent, or Firm—Timothy M. Honeycutt

(57) ABSTRACT

Various embodiments of a plasma coil, methods of making the same, a processing apparatus utilizing plasma processes and methods of manufacture are disclosed. In one aspect, a plasma coil is provided that includes a first conductor coil that has a plurality of turns. An innermost of the plurality of turns terminates to define a central void portion and an outermost of the plurality of turns defines a peripheral portion. A first conductor plate is positioned in the central void portion of and coupled in series to the first conductor coil. The conductor plate provides a more uniform and intense electrical field in order to retard residue formation on plasma chamber windows.

38 Claims, 5 Drawing Sheets

PLASMA COIL

BACKGROUND OF THE INVENTION

1. Field of the Invention

This invention relates generally to semiconductor processing, and more particularly to a plasma coil and to a processing tool incorporating the same.

2. Description of the Related Art

Physical vapor deposition, reactive ion etching, chemical plasma etching and physical sputtering represent just a few of the potential uses for plasma processes in semiconductor device fabrication. Plasmas are usually created by ionizing a gas or gaseous mixture to produce concentrations of free electrons, ions and neutrals. Most conventional plasma generating tools induce the initial ionization of the gas or gaseous mixture and provide the subsequent maintenance of the glow discharge by exposing the gas to an electric field. Some conventional plasma tools utilize a DC diode configuration to supply the electric field. Others utilize a radio frequency ("rf") diode configuration in which the electric field is generated by passing an alternating current through a conducting coil. The frequency of the voltage signal is commonly 13.56 MHz, although some systems have been developed to function in the low GHz and sub-MHz ranges.

One conventional plasma tool utilizing a radio frequency system operating at 13.56 MHz includes a low pressure chamber in which a semiconductor wafer is placed. A quartz plasma plate or window is seated at the top of the chamber. A conducting plasma coil is positioned above the quartz window. The coil consists of a single winding, planar coil that has a plurality of outer turns or windings and a central sub-winding or segment. The central sub-winding is positioned such that there is a void in the central portion of the coil. Power is supplied to the plasma coil by way of a rf power source and a tuning circuit that consists of an impedance matching network and a resonance frequency tuner. The coil is connected in series to the matching circuit. In this regard, a bridge is established between one of the outer turns and the inner coil sub-segment, and the sub-segment itself is, in turn, connected in series to the tuning circuit.

Manufacturing experience has revealed an operational shortcoming associated with this conventional plasma tool. After a few hours of operation of the tool utilizing fluorine-containing chemistries, a polymer residue forms on the underside of the quartz plate. Although the residue tends to form on every region of the underside of the plate that is not physically overlapped by a portion of the plasma coil, the residue tends to form with greater thickness and speed in the portion of the plate that corresponds to the central void of the plasma coil. The mechanism by which the residue forms in the central portion of the quartz plate is thought to be the result of a significant variation in the electric field generated by the plasma coil across the diameter of the quartz plate. In particular, the void region of the coil exhibits a much lower electric field intensity. This diminished electric field intensity in the vicinity of the central portion of the quartz plate is thought to result in fewer ionic collisions with the underside of the quartz plate during plasma processing which might otherwise prevent or retard the formation of the polymer residue.

The formation of the polymer film, particularly within the central portions of the quartz plate, presents two pernicious side effects. The first is the need for more frequent cleanings of the plasma chamber. Any cleaning of a plasma tool ordinarily involves shutting down the tool, breaking open the chamber and cleaning the various components therein. This involves both operator cost as well as diminished product throughput. A second side effect is associated with potential contamination of semiconductor workpieces. Flecks of the fluorine-based polymer residue can break off during subsequent processing of a semiconductor wafer. These unwanted particles of polymer can fall on critical circuit structures of a semiconductor device and lead to yield and performance problems.

The problem of fluorine-based polymer residue build-up presents special difficulties in processes that utilize processing chambers containing aluminum structures and surfaces. Aluminum-fluorine residues tend to be chemically unreactive, and thus resistant to plasma cleaning processes. Thus, conventional waferless plasma clean steps may not adequately remove such chemically stable compounds as aluminum fluoride, for example.

The present invention is directed to overcoming or reducing the effects of one or more of the foregoing disadvantages.

SUMMARY OF THE INVENTION

In accordance with one aspect of the present invention, a plasma coil is provided that includes a first conductor coil and a first conductor plate coupled in series to the first conductor coil.

In accordance with another aspect of the present invention, a processing apparatus is provided that includes a chamber that has an insulator plate. A plasma coil is positioned above the insulator plate and has a first conductor coil and a first conductor plate coupled in series to the first conductor coil. A first radio frequency power source is coupled to the plasma coil.

In accordance with another aspect of the present invention, a plasma coil is provided that includes a first conductor coil that has a plurality of turns. An innermost of the plurality of turns terminates to define a central void portion and an outermost of the plurality of turns defines a peripheral portion. A first conductor plate is positioned in the central void portion of and coupled in series to the first conductor coil.

In accordance with another aspect of the present invention, a method of manufacturing is provided that includes introducing a processing gas into a processing chamber that has an insulator plate. A plasma coil is positioned proximate an external surface of the insulator plate. A plasma is excited in the processing chamber by applying radio frequency power to the plasma coil. A footprint of any residue forming on an internal surface of the insulator plate is determined. A conductor plate is formed that has a footprint that approximates the footprint of the residue. The conductor plate is coupled to the plasma coil in series whereby the conductor plate is positioned proximate the external surface of the insulator plate and adjacent to the residue.

In accordance with another aspect of the present invention, a method of manufacturing a plasma coil is provided that includes providing a coil with an outer arcuate segment and an inner segment connected in series. The first segment is removed and a first conductor plate is coupled in series to the outer arcuate segment in place of the inner segment.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
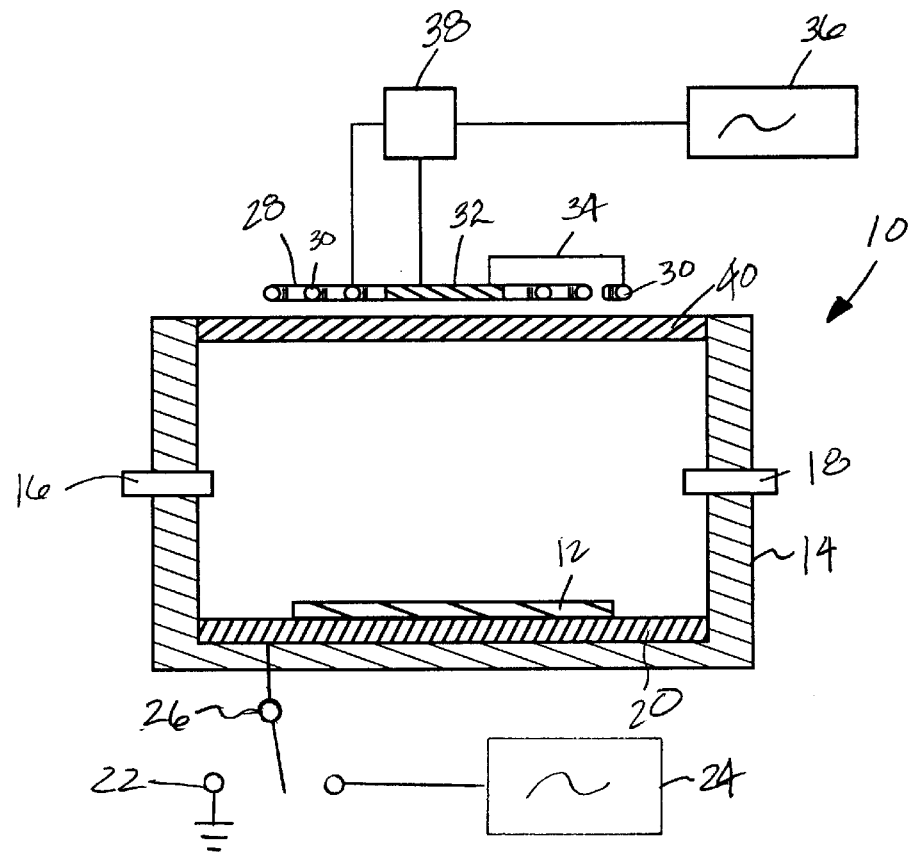
FIG. 1 is a cross-sectional view of an exemplary embodiment of a plasma processing apparatus in accordance with the present invention.

In the drawings described below, reference numerals are generally repeated where identical elements appear in more than one figure. Turning now to the drawings, and in particular to FIG. 1, therein is shown a cross-sectional view of an exemplary embodiment of a plasma apparatus 10 suitable for plasma processing a semiconductor workpiece or wafer 12. The plasma device 10 includes a processing chamber 14 in which the semiconductor workpiece 12 is positioned. The chamber 14 may be evacuated and/or provided with various processing gases via one or more inlets and outlets, two of which are shown and designated 16 and 18 respectively. The semiconductor workpiece 12 is seated on a chuck 20 that may be an electrostatic chuck or a more traditional mechanical type chuck as desired. The chuck 20 may be connected to ground 22, or a rf power source 24 or may be unbiased as represented schematically by the switch 26. Excitation energy to strike a plasma within the chamber 14 is provided by a plasma coil 28. The plasma coil 28 consists of a conductor coil 30 connected in series to a conductor plate 32 by a bridge 34. The coil 28 is coupled to a rf power source 36 that may be provided with a tuning circuit 38 that is operable to provide impedance matching for efficient power transfer as well as frequency tuning in order to provide for resonance at the operating frequency of the rf power supply 36. The rf power supply 36 may operate at a variety of well-known rf and/or microwave frequencies. In an exemplary embodiment, the power supply 36 operates at 13.56 MHz.

The plasma coil 28 is separated from the chamber 14 by an insulating window or plate 40. The plate 40 may be composed of a variety of well-known insulating materials, such as, for example, quartz, well-known ceramics, such as sapphire, various plastics or the like.

Figure 2:
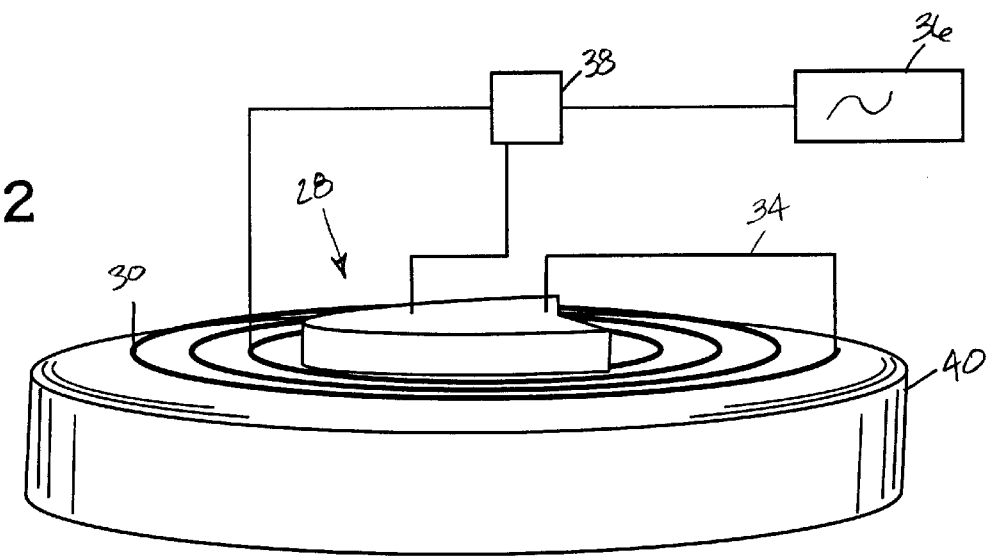
FIG. 2 is a pictorial view of an exemplary embodiment of a plasma coil in accordance with the present invention.
Figure 3:
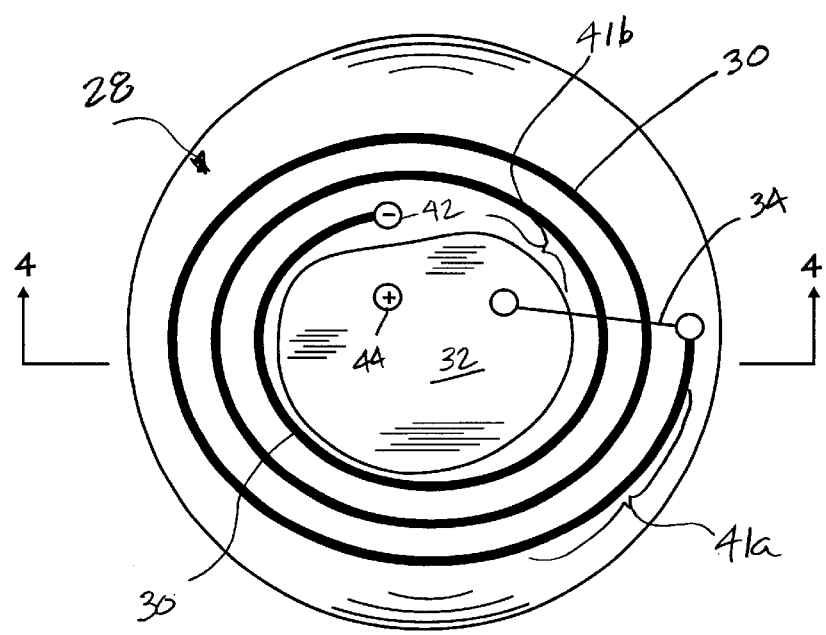
FIG. 3 is a top view of the exemplary plasma coil of FIG. 2 in accordance with the present invention.
Figure 4:
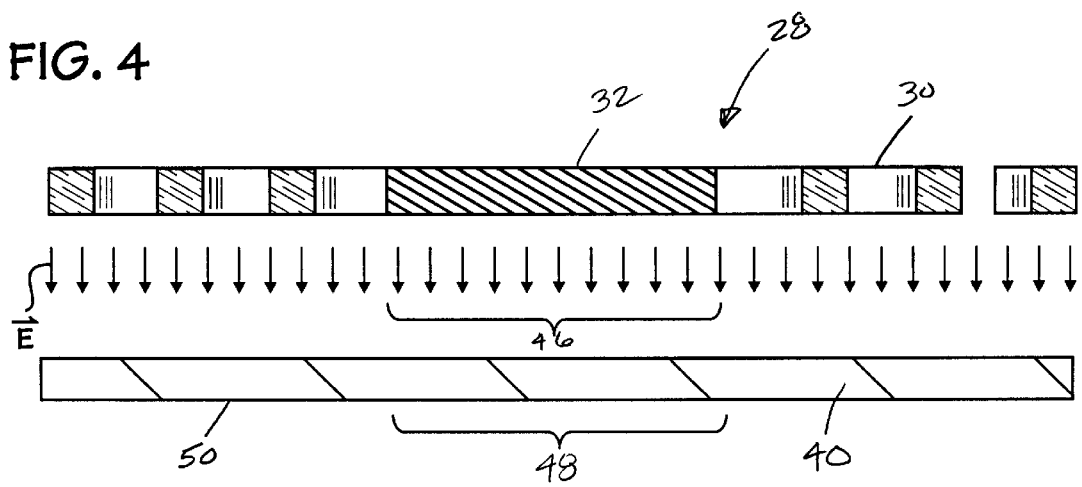
FIG. 4 is a cross-sectional view of FIG. 4 taken at section 4—4 in accordance with the present invention.

The detailed structure of the plasma coil 28 may be understood by referring now to FIGS. 2, 3 and 4. FIG. 2 is a pictorial view and FIG. 3 is a top view of the plasma coil 28 and the insulator plate 40. FIG. 4 is a cross-sectional view of FIG. 3 taken at section 3—3. The coil 28 is suspended above the insulator plate 40 by support structure that is not shown for simplicity of illustration. The gap between the coil 28 and the plate 40 is largely a matter of design discretion. In an exemplary embodiment, the gap may be from about a few millimeters up to several centimeters. The coil 28 consists of a conductor coil 30 that has a plurality of loops or turns. The outermost turn defines a peripheral portion 41a and the innermost turn terminates to define a central void portion 41b.

The conductor coil 30 is connected in series to the conductor plate 32 by way of the conductor bridge 34. Electrical connection to the tuning circuit 38 is by way of respective terminals 42 and 44 of the conducting coil 30 and the conductor plate 32. The signs associated with the terminals 42 and 44 are arbitrary in that the polarities of the terminals 42 and 44 oscillate according to the frequency of the rf power supply 36.

The conductor plate 32 is provided with a selected footprint, best seen in FIG. 3. The footprint is selected so that the electric field generated when the coil 28 is active will be strengthened in intensity in the region 46 beneath the conductor plate 32. The region 46 will have the same general footprint as the conductor plate 32. In this way, the electric field intensity proximate the region 48 of the underlying surface 50 of the insulator plate 40 will be higher than in a conventional plasma coil as described more fully below. The conductor plate 32 is positioned within the central void 41b. If desired, the conductor plate 32 and the coil 30 may be concentrically arranged.

Figure 5:
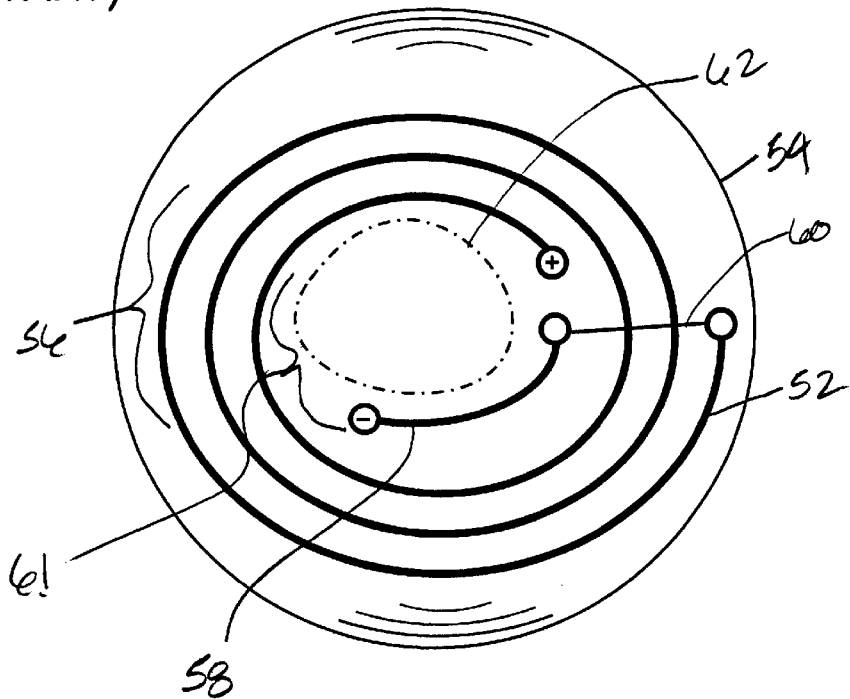
FIG. 5 is a top view of a conventional plasma coil and insulator window.
Figure 6:
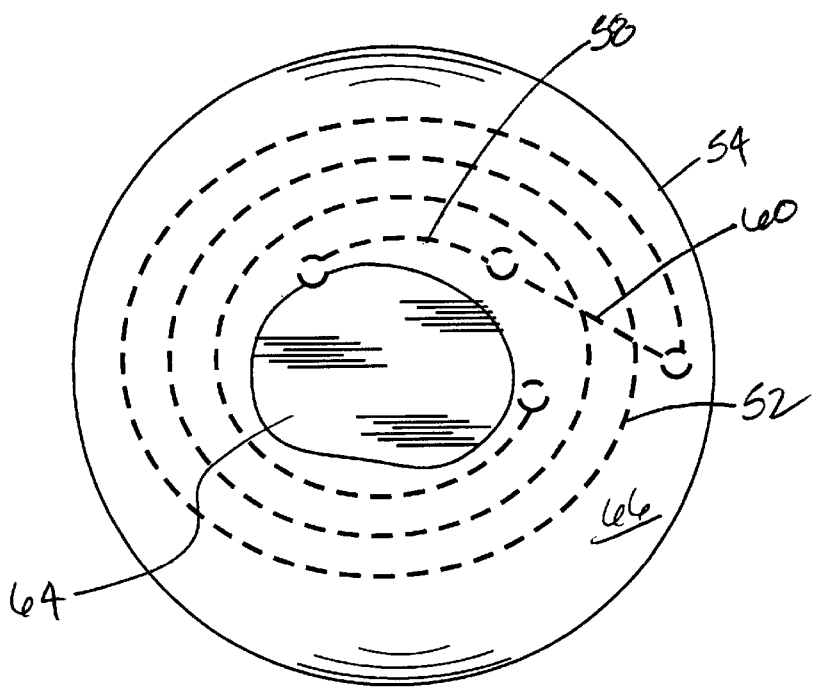
FIG. 6 is a bottom view of the conventional plasma coil and insulator window of FIG. 5.

The selection of the footprint of the conductor plate 32 may be understood by considering the design and operation of a typical conventional single winding planar plasma coil 52 depicted in FIGS. 5 and 6. FIG. 5 shows a top view of the conventional plasma coil 52 positioned over a conventional insulator plate 54. Note that the conventional coil 52 consists of an outer portion or segment 56 and an inner portion or segment 58 that is connected to the outer portion 56 by a conductor bridge 60. The typical conventional central coil portion 58 is a truncated coil turn. The small footprint presented by the central portion 58 produces a physical void or open space 61 in the central portion of the coil 52.

Manufacturing experience with a conventional tool utilizing a plasma coil like the coil 52 has demonstrated that the central void 61 at the center of the conventional coil 52 results in a diminished zone 62 of electric field intensity. The fallout of this low intensity zone 62 is illustrated in FIG. 6, which is a bottom view of the insulator plate 54 with the conventional coil 52 shown in phantom. As a result of the low intensity zone 62 visible in FIG. 5, a significant build-up of a polymer residue 64 forms on the underside 66 of the plate 54 as shown. The footprint of the polymer residue 64 will generally correspond approximately to the footprint of the low intensity zone 62. The composition of the polymer residue 64 will depend on the types of processing gases used and the compositions of the structures and surfaces in the processing chamber 14. For example, fluorine and chlorine compounds are frequently used processing gases in processing chambers with internal aluminum structures and surfaces. Such conditions can lead to formation of a residue of aluminum-fluorine and aluminum-chlorine compounds. Note that these classes of compounds represent just two potential classes of compounds that make up the residue 64. As noted elsewhere herein, the removal of aluminum-fluorine polymer compounds in particular has proven to be a difficult task.

The illustrative embodiment of the plasma coil 28 shown in FIG. 3 is designed to overcome the difficulties associated with the conventional coil design depicted in FIGS. 5 and 6. In order to eliminate the low intensity zone 62, the conventional inner coil segment 58 shown in FIG. 5 is eliminated in favor of the conductor plate 32. The conductor plate 32 is advantageously provided with a footprint that greatly increases the intensity of the electric fields propagated beneath the coil 28, particularly in the central portion thereof. In this way, ionic bombardment of the underside of the insulator plate 40 is enhanced and the formation of a polymer residue, such as the residue 64 depicted in FIG. 6, is slowed.

Figure 7:
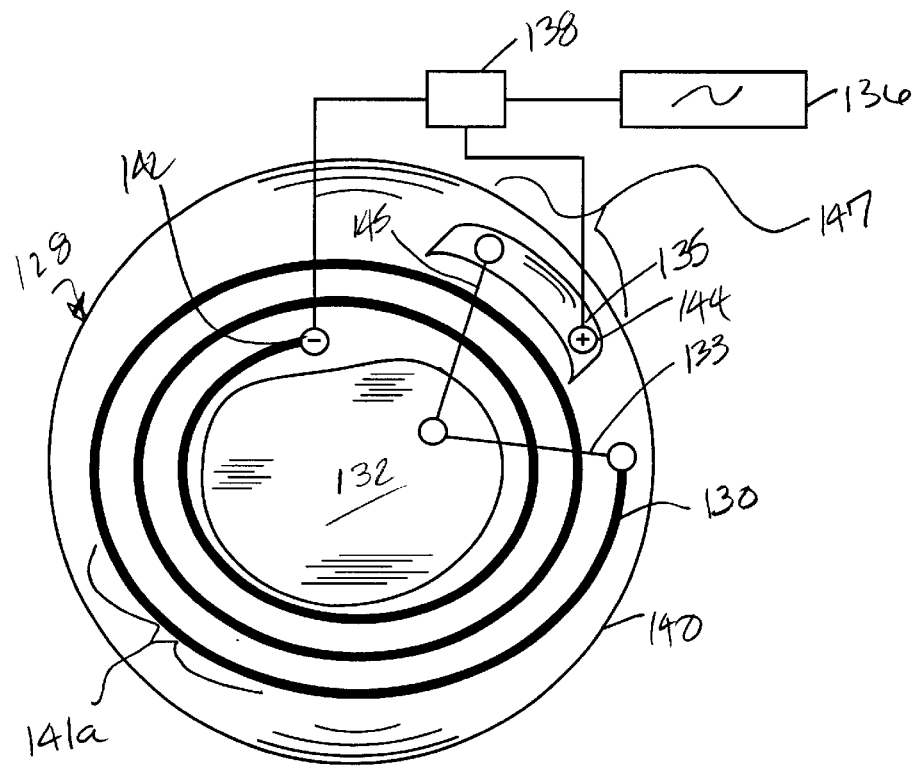
FIG. 7 is a top view of an alternate exemplary embodiment of a plasma coil in accordance with the present invention.

In the foregoing illustrative embodiment, the conductor plate 32 is positioned centrally within the various turns of the conductor coil 30. However, other arrangements are envisioned within the spirit and scope of the present invention. FIG. 7 illustrates a top view of such an alternate exemplary embodiment. In this embodiment, the plasma coil, now designated 128, includes a conducting coil 130 that is connected in series to a conductor plate 132 of the type described elsewhere herein by a conductor 133. An additional conductor plate 135 is positioned external to the peripheral portion 141a of the conducting coil 130. A rf power supply 136 is connected via a tuning circuit 138 of the type described elsewhere herein to a terminal 142 of the conducting coil 130 and a terminal 144. The conductor plates 132 and 135 are series connected via a conductor 145. This arrangement may be advantageous if circumstances are envisioned where enhanced magnetic and electric field intensities desired in, for example, the region 147 of the insulator plate 140.

Figure 8:
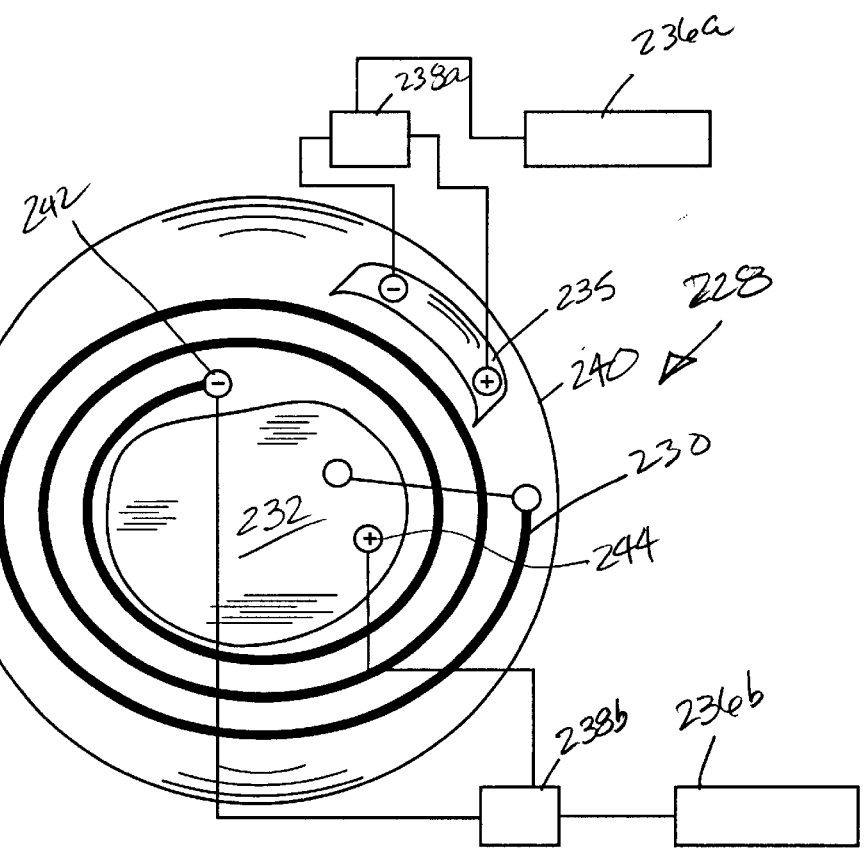
FIG. 8 is a top view of another alternate exemplary embodiment of a plasma coil in accordance with the present invention.

Another alternate exemplary embodiment may be understood by referring now to FIG. 8, which is a top view like FIG. 7. In this illustrative embodiment, multiple conductor plates are provided as with the embodiment depicted in FIG. 7. However, in this illustrative embodiment, separate rf power supplies 236a and 236b are provided. The power supply 236a is connected to the conductor plate 235 through a tuning circuit 238a. The power supply 236b is coupled to the conductor plate 232 and the conductor coil 230 via respective terminals 242 and 244 as generally described above in conjunction with the embodiment of FIG. 7. As in the other illustrative embodiments, impedance matching and circuit tuning may be provided by tuning circuits 238a and 238b respectively coupled to the rf power supplies 236a and 236b. This arrangement may be advantageous in circumstances where, for example, a particular region of the insulator plate 240 proves to be particularly susceptible to residue formation and thus a dedicated rf power supply for one or the other of the conductor plates 232 or 235 is desirable to provide a requisite level of electric field intensity.

Figure 9:
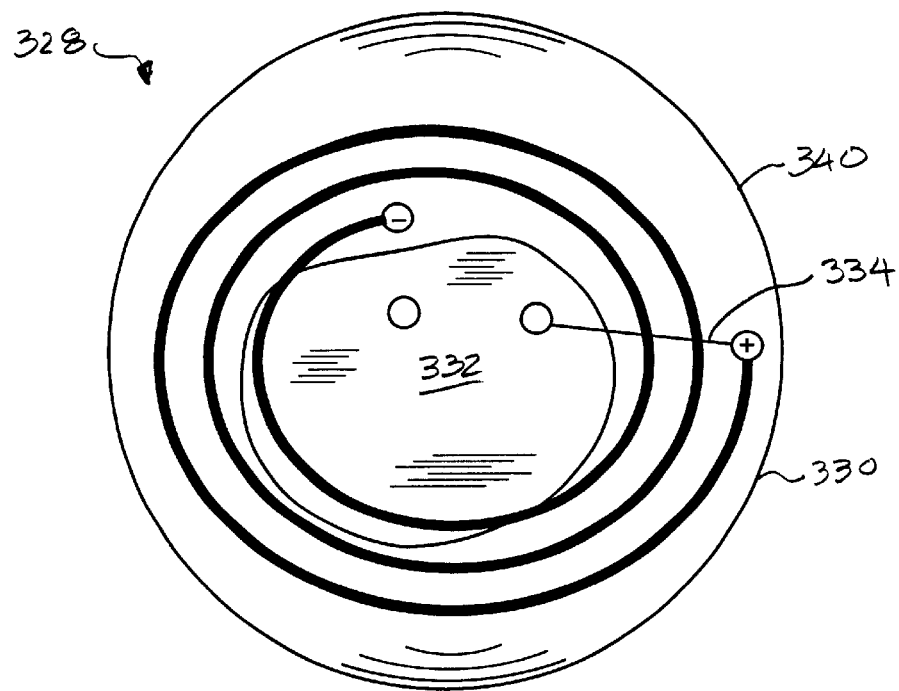
FIG. 9 is a top view of another alternate exemplary embodiment of a plasma coil in accordance with the present invention.

FIG. 9 depicts the top view of another alternate exemplary embodiment of the plasma coil, now designated 328, in accordance with the present invention. In this illustrative embodiment, the plasma coil 328 includes a conductor coil 330 series connected to a conductor plate 332. The series connection is again via a conductor 334. In this illustrative embodiment, the conductor plate 332 is positioned below the conductor coil 330, that is, between the conductor coil 330 and the underlying insulator plate 340. This arrangement provides a little more flexibility in the selection of the footprint of the conductor plate 332. There will be some tradeoff associated with the overlap between portions of the conductor coil 330 and the footprint of the conductor plate 332 in that such an overlap provides an effective shortening of the antenna length of the conductor coil 330.

Figure 10:
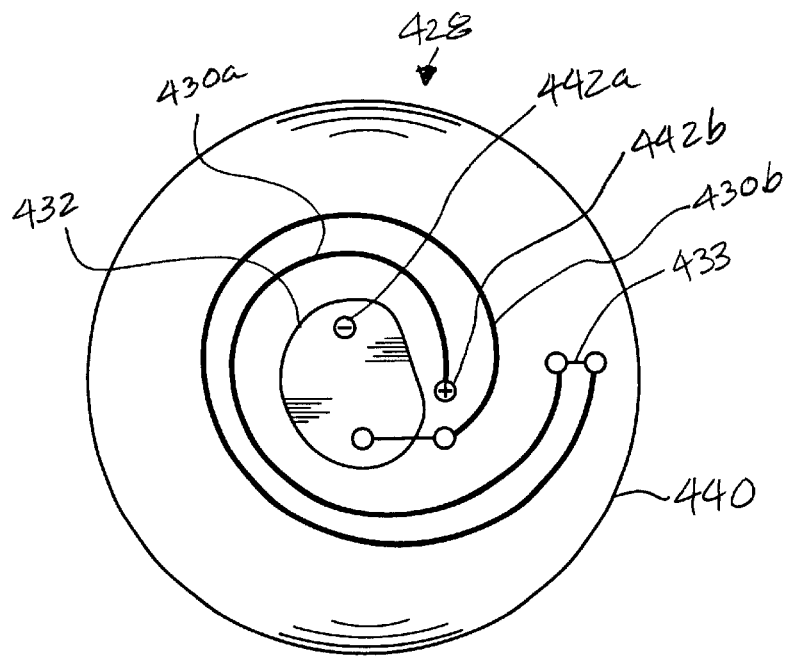
FIG. 10 is a top view of another alternate exemplary embodiment of a plasma coil in accordance with the present invention.

In the foregoing illustrative embodiments, a single winding coil is utilized as the conductor coil connected in series with one or more conductor plates. However, nested or multiple coil arrangements are envisioned. Such an optional arrangement is illustrated in FIG. 10, which is a top view of another alternate exemplary embodiment of the plasma coil, now designated 428. In this illustrative embodiment, the plasma coil 428 includes a pair of nested coils 430a and 430b that are connected in series by way of a conductor plate 432 and a conductor bridge or wire 433. The coils 430a and 430b are positioned above the insulating plate 440 as generally described above. Connection to an external rf power supply (not shown) is by way of terminals 442a and 442b. The conductor plate 422 may be configured as described elsewhere herein.

The conductor plate in any of the foregoing illustrative embodiments is advantageously composed of a conducting material. Exemplary materials include, for example, copper, platinum, gold, stainless steel, alloys of these or the like. Laminate structures are possible. In an exemplary embodiment, the plate 32, 132, 232, 332 or 432 is composed of copper coated with silver.

The skilled artisan will appreciate that the various embodiments disclosed herein provided for improved electric field propagation from a plasma coil. A more uniform electric field results in better ionic bombardment of selected portions of a plasma chamber window positioned adjacent to the coil. Residue formation on the chamber window is slowed, resulting in longer mean times between chamber cleaning and less potential for wafer contamination due to residue particles breaking off and landing on wafer surfaces.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, jot equivalents and alternatives falling within the spirit and scope of the invention as defined by the following appended claims.

What is claimed is:

1. A plasma coil, comprising:
   a first conductor coil;
   a first conductor plate coupled in series to the first conductor coil; and
   an insulator plate having a side positioned proximate the first conductor coil and the first conductor plate.

2. The plasma coil of claim 1, wherein a portion of the first conductor plate overlaps with the first conductor coil.

3. The plasma coil of claim 2, wherein first conductor plate is positioned between the first conductor coil and the insulator plate.

4. The plasma coil of claim 1, wherein the first conductor coil comprises a plurality of turns, an innermost of the plurality of turns terminating to define a central void portion, and an outermost of the plurality of turns defining a peripheral portion.

5. The plasma coil of claim 4, wherein the first conductor plate is positioned in the central void portion.

6. The plasma coil of claim 5, wherein the first conductor coil and the first conductor plate are concentrically arranged.

7. The plasma coil of claim 4, wherein the first conductor plate is positioned external to the peripheral portion.

8. The plasma coil of claim 1, wherein the first conductor plate and the first conductor coil overlap.

9. The plasma coil of claim 1, wherein the first conductor plate and the first conductor coil are coplanar.

10. The plasma coil of claim 1, comprising a second conductor plate coupled in series to the first conductor plate.

11. The plasma coil of claim 1, comprising a second conductor coil coupled in series to the first conductor coil.

12. A processing apparatus, comprising:
a chamber having an insulator plate;
a plasma coil positioned above the insulator plate and having a first conductor coil and a first conductor plate coupled in series to the first conductor coil; and
a first radio frequency power source coupled to the plasma coil.

13. The processing apparatus of claim 12, wherein a portion of the first conductor plate overlaps with the first conductor coil.

14. The processing apparatus of claim 12, wherein first conductor plate is positioned between the first conductor coil and the insulator plate.

15. The processing apparatus of claim 12, wherein the first conductor coil comprises a plurality of turns, an innermost of the plurality of turns terminating to define a central void portion, and an outermost of the plurality of turns defining a peripheral portion.

16. The processing apparatus of claim 13, wherein the first conductor plate is positioned in the central void portion.

17. The processing apparatus of claim 16, wherein the first conductor coil and the first conductor plate are concentrically arranged.

18. The processing apparatus of claim 16, wherein the first conductor coil and the first conductor plate are concentrically arranged.

19. The processing apparatus of claim 13, wherein the first conductor plate is positioned external to the peripheral portion.

20. The processing apparatus of claim 13, wherein the first conductor plate is positioned in the central void portion.

21. The processing apparatus of claim 12, wherein the first conductor plate and the first conductor coil overlap.

22. The processing apparatus of claim 12, wherein the first conductor plate and the first conductor coil are coplanar.

23. The processing apparatus of claim 12, comprising a second conductor plate coupled in series to the first conductor plate.

24. The processing apparatus of claim 12, comprising a second conductor plate and a second radio frequency power source coupled in series to the second conductor plate.

25. The processing apparatus of claim 12, comprising a second conductor coil coupled in series to the first conductor coil.

26. A plasma coil, comprising:
a first conductor coil having a plurality of turns, an innermost of the plurality of turns terminating to define a central void portion, and an outermost of the plurality of turns defining a peripheral portion; and
a first conductor plate positioned in the central void portion of and coupled in series to the first conductor coil.

27. The plasma coil of claim 26, comprising a second conductor plate coupled in series to the first conductor plate.

28. The plasma coil of claim 27, wherein the second conductor plate is positioned external to the peripheral portion of the first conductor coil.

29. A method of manufacturing, comprising:
introducing a processing gas into a processing chamber having an insulator plate;
positioning a plasma coil proximate an external surface of the insulator plate;
exciting a plasma in a processing chamber by applying radio frequency power to the plasma coil;
determining a footprint of any residue forming on an internal surface of the insulator plate;
forming a conductor plate having a footprint that approximates the footprint of the residue; and
coupling the conductor plate to the plasma coil in series whereby the conductor plate is positioned proximate the external surface of the insulator plate and adjacent to the residue.

30. The method of claim 29, wherein the processing gas comprises a fluorine compound.

31. The method of claim 29, wherein the plasma coil comprises a central void portion, the conductor plate being coupled in the central void portion.

32. The method of claim 29, wherein the plasma coil comprises a peripheral portion, the conductor plate being coupled external to the peripheral portion.

33. The method of claim 29, wherein the conductor plate is formed with a larger footprint than the residue.

34. A method of manufacturing a plasma coil, comprising:
providing a coil having an outer arcuate segment and an inner segment connected in series;
removing the first segment; and
coupling a first conductor plate in series to the outer arcuate segment in place of the inner segment.

35. The method of claim 34, wherein the outer arcuate segment has a central void portion and an outer peripheral portion, the inner segment being positioned in the central void portion, the method comprising positioning the conductor plate in the central void portion.

36. The method of claim 34, wherein the outer arcuate segment has a central void portion and an outer peripheral portion, the method comprising positioning the first conductor plate external to the outer peripheral portion.

37. The method of claim 34, comprising coupling a second conductor plate in series to the first conductor plate.

38. The method of claim 37, wherein the outer arcuate segment has a central void portion and an outer peripheral portion, the method comprising positioning the second conductor plate external to the outer peripheral portion.

* * * * *